(12) United States Patent
Hartmann et al.

(10) Patent No.: US 9,041,295 B2
(45) Date of Patent: May 26, 2015

(54) INTEGRATED LED AND SENSOR DEVICE

(75) Inventors: Paul Hartmann, Weiz (AT); Hans Hoschopf, Jennersdorf (AT); Stefan Gianordoli, Fuerstenfeld (AT); Stefan Tasch, Jennersdorf (AT)

(73) Assignee: Tridonic Jennersdorf GmbH, Jennersdorf (AT)

( * ) Notice: Subject to any disclaimer, the term of this patent is extended or adjusted under 35 U.S.C. 154(b) by 689 days.

(21) Appl. No.: 13/263,709

(22) PCT Filed: Mar. 31, 2010

(86) PCT No.: PCT/EP2010/054298
§ 371 (c)(1),
(2), (4) Date: Nov. 18, 2011

(87) PCT Pub. No.: WO2010/115801
PCT Pub. Date: Oct. 14, 2010

(65) Prior Publication Data
US 2012/0068600 A1    Mar. 22, 2012

(30) Foreign Application Priority Data

Apr. 9, 2009    (DE) ............... 20 2009 005 454 U

(51) Int. Cl.
| | |
|---|---|
| H05B 33/08 | (2006.01) |
| F21V 23/04 | (2006.01) |
| F21K 99/00 | (2010.01) |
| F21V 3/00 | (2006.01) |
| F21V 23/00 | (2006.01) |
| H05B 37/02 | (2006.01) |

(Continued)

(52) U.S. Cl.
CPC ............. *F21V 23/0464* (2013.01); *F21K 9/135* (2013.01); *F21K 9/137* (2013.01);

(Continued)

(58) Field of Classification Search
CPC ......... H01L 31/00; H01L 31/02; H01L 29/00; H01L 29/02; H01L 33/00; H05B 37/00; H05B 37/02; H05B 37/0209; H05B 37/0218; H05B 37/0245; H05B 37/0254; H05B 37/029; H05B 33/00; H05B 33/02
USPC ......... 315/149, 152, 154, 155, 153, 150, 151, 315/51, 52, 291, 307; 257/79, 84, 80, 13
See application file for complete search history.

(56) References Cited

U.S. PATENT DOCUMENTS

| | | |
|---|---|---|
| 5,962,906 A | 10/1999 | Liu |
| 6,710,376 B2 | 3/2004 | Worley |

(Continued)

FOREIGN PATENT DOCUMENTS

| | | |
|---|---|---|
| DE | 102004047681 B4 | 4/2006 |
| DE | 102006037292 A1 | 4/2007 |

(Continued)

OTHER PUBLICATIONS

International Patent Search Reaport PCT/EP2010/054298, dated Sep. 20, 2010, 6 pages.

*Primary Examiner* — David H Vu
(74) *Attorney, Agent, or Firm* — Lee & Hayes, PLLC

(57) ABSTRACT

A retrofit light emitting diode (LED) module may include a carrier with at least one LED, a retrofit connection for mechanical and electrical contact-connection to conventional lamp holders, and an electronic system for driving the at least one LED. At least one part of the electronic system is integrated into the carrier, and the electronic system comprises a sensor system. A retrofit LED module system may include at least two retrofit LED modules and at least one control unit which regulates the retrofit LED modules in an adaptive and synchronized manner.

17 Claims, 3 Drawing Sheets

(51) Int. Cl.
*F21Y 101/02* (2006.01)
*G01J 1/42* (2006.01)

(52) U.S. Cl.
CPC ................ *F21V 3/00* (2013.01); *F21V 23/005* (2013.01); *F21Y 2101/02* (2013.01); *H05B 33/0803* (2013.01); *H05B 37/0218* (2013.01); *Y02B 20/383* (2013.01); *Y02B 20/46* (2013.01); *G01J 2001/4252* (2013.01); *F21V 23/0457* (2013.01); *G01J 1/4204* (2013.01)

(56) References Cited

U.S. PATENT DOCUMENTS

| | | |
|---|---|---|
| 2003/0117803 A1 | 6/2003 | Chen |
| 2004/0105264 A1 | 6/2004 | Spero |
| 2006/0072317 A1 | 4/2006 | Noordhoek |
| 2006/0181416 A1 | 8/2006 | Chen |
| 2007/0007898 A1 | 1/2007 | Bruning |
| 2007/0195544 A1 | 8/2007 | Graves |
| 2008/0246844 A1 | 10/2008 | Chan |
| 2010/0171145 A1* | 7/2010 | Morgan et al. .................. 257/99 |

FOREIGN PATENT DOCUMENTS

| | | |
|---|---|---|
| EP | 1988577 A1 | 11/2008 |
| WO | WO03055273 A2 | 7/2003 |
| WO | WO2010040645 A2 | 4/2010 |
| WO | WO2010094567 A1 | 8/2010 |

* cited by examiner

INTEGRATED LED AND SENSOR DEVICE

This Application is a U.S. National Stage of International Application No. PCT/EP2010/054298, filed Mar. 31, 2010, which claims foreign priority to DE Application No. 20 2009 005 454.3, filed Apr. 9, 2009, both of which are incorporated herein by reference.

TECHNICAL FIELD

The present invention relates to a retrofit LED module, i.e. an LED module in a housing, the connections (pins, mount, . . .) of which are embodied such that the LED module can be used as a replacement or substitute for existing other luminous means, in particular as an incandescent bulb replacement or low-voltage or e.g. 20 volt halogen lamp replacement. In the description and the claims, "LED" always encompasses "OLED" as well.

BACKGROUND

For correct operation of a light emitting diode (LED), the electric current supplied has to be adapted to the operating properties of the LED. For this purpose, a driving electronic system is used, which can be constructed in discrete fashion, i.e. consists of individual electrical components. The latter are situated within the housing, usually below the LED chip in the lamp base, which, in the case of lamps operated by power supply current, simultaneously constitutes electrical and mechanical connection to the lampholder.

In possible driving of the LED upon connection to power supply system voltage, a transformer is used, which transforms the AC voltage to an operating voltage suitable for LED circuit arrangements. Furthermore, an AC-DC rectifier is connected downstream of the transformer, wherein both components together fulfill the function of a power supply unit. For the purpose of voltage smoothing, a capacitor is connected in parallel with the LED connected to the power supply unit as a load.

For suitable current and/or voltage limiting, however, there are also a large number of other possible ballasts.

DE 10 200404768 B4 discloses an LED circuit arrangement in which a voltage supply of, for example, 110 or 220 volts AC voltage is provided. A bridge rectifier, the rectifier diodes of which are radiation-emitting LEDs, is used as rectifier of the AC voltage. Two further LEDs are connected to the bridge rectifier as load. Furthermore, the arrangement comprises at least two multi-chip LEDs each containing two LEDs of the bridge rectifier and one LED of the load.

EP 07 117 245.6 discloses an LED module comprising an LED chip fitted directly or indirectly on a plate composed of silicon. The plate projects laterally beyond the area of the LED chip, which comprises an active light-emitting layer and a substrate. At least one electrical component constituting part of the control circuit of the LED chip is integrated in the silicon plate.

U.S. Pat. No. 6,710,376 B2 discloses an optocoupler consisting completely of silicon and comprising two substrate layers separated by a transparent insulator. An LED is fitted on the top side of the lower layer and the top side of the upper layer has a light sensor, wherein the light sensor is configured such that it can detect light emitted by the LED. Furthermore, methods are disclosed as to how circuits can be insulated from the LED or the light sensor, that CMOS and bipolar circuits can be added to both silicon layers in any desired manner.

DE 10 2006 037292 A1 discloses a light source comprising a plurality of LEDs fixed on a substrate, and a sensor for measuring light from the LEDs. Each LED emits light having a different spectrum than the other LEDs. The sensor generates a plurality of signals, wherein each signal is characterized by a sensor value that is proportional to the light intensity emitted by a corresponding one of the LEDs.

U.S. Pat. No. 5,962,906 discloses a possible construction of a diode color sensor, in particular of a CMOS sensor.

The problem that exists, then, is that a constant lighting, for example of rooms or of display windows, under a wide variety of conditions, such as different times of day, is desirable. On account of the different conditions, however, an optimum artificial lighting also has to be individually adaptable thereto. At the same time, it is desirable to utilize existing connection possibilities when using new and more energy-saving technologies, as is possible with retrofit LED modules as an incandescent bulb replacement. However, they have to fulfill predefined standards such as dimensions of the lampholders or properties of the voltage supply.

SUMMARY

The invention takes this problem as a starting point and provides a solution as to how retrofit LED modules can be improved such that they provide for individual and automated lighting and at the same time advantageously utilize existing means such as supply of system current from the grid or lampholder dimensions, or conform thereto.

This object is achieved according to the invention by means of the features of the independent claim. The dependent claims develop the central concept of the invention in a particularly advantageous manner.

Therefore, the invention proposes a retrofit LED module which, by virtue of intelligent control, is individually adjustable and operates adaptively.

For this purpose, an LED module comprises a carrier with at least one LED. The LED module has a retrofit connection, whereby it can be mechanically and electrically connected to conventional lampholders or sockets. Furthermore, the LED module comprises an electronic system for driving the at least one LED. In this case, a part of said electronic system is advantageously integrated into the carrier. The electronic system comprises a light sensor and/or a daylight sensor and/or a color sensor system. Therefore, the actual sensor and/or the signal processing electronic system can be integrated in the carrier.

In this case, the light sensor is preferably designed to detect the brightness or other optical properties of the light emitted by the LED module. By contrast, the daylight sensor is advantageously designed to detect the brightness of the ambient light, and is preferably uninfluenced by the light emitted by the LED module. The color sensor system in turn can be designed to detect the color spectrum of the light emitted by the LED module and/or of the ambient light. One example is an RGB sensitive color sensor. Of course, it is also possible here for a sensor to measure both brightness and color spectrum.

The carrier consists of one or a plurality of substrates, preferably composed of silicon or a silicon compound.

The invention furthermore provides for the electronic system integrated into the carrier to be realized as chip-on-board. In the case of chip-on-board technology (COB), unpackaged semiconductors, for example an integrated circuit (composed of silicon or other basic substances), are adhesively bonded directly onto the printed circuit board and then cold-welded with microwires to the circuit board (wire bonding).

A further possibility consists in the fact that the electronic system integrated into the carrier is embodied as an integrated circuit on the substrate of the carrier.

The invention furthermore relates to a driving electronic system which regulates the operation of the retrofit LED module, in particular drives the LEDs.

In this case, the electronic system can be embodied as an intelligent control circuit, for example as an ASIC or microcontroller. This is used for an adaptive control of the LED module.

It is likewise conceivable for the electronic system to comprise a temperature sensor system.

It is also possible for the electronic system to comprise a motion sensor system.

Furthermore, the electronic system can comprise an acoustic sensor system.

The invention furthermore provides for the sensor system which the electronic system comprises to be situated within the emission angle of the at least one LED and/or shaded thereby.

Finally, the invention provides a driving electronic system that enables the at least one LED to be dimmed.

The LED module can comprise different-colored LEDs. The latter can involve in each case at least one red, one green and one blue LED. These are drivable independently of one another. Different color spectra and brightnesses of the emitted light can be generated as a result.

The use of at least one blue LED is likewise conceivable. White light can be generated by means of said at least one blue LED, using color conversion means.

Furthermore, the invention provides for the sensor system, in particular the light sensor system, to be activated only in short time intervals temporally separated from one another. By contrast, the at least one LED is switched off in these time intervals.

Finally, the invention relates to a system consisting of at least two LED modules. In this case, the LED modules each have all the features described above. Furthermore, the system has at least one control unit. The latter regulates the system in an adaptive and synchronized manner.

In this case, the system comprises at least one sensor, in particular a light sensor system. The latter is activated only in short time intervals temporally separated from one another. By contrast, the LEDs of the at least two LED modules are switched off in these time intervals.

The system is embodied such that the at least one control unit and the retrofit LED modules can communicate with one another.

Furthermore, each retrofit LED module has a unique address and/or an assignment to a control unit primarily responsible therefore.

The system is adaptable to the effect that each individual retrofit LED module is adjustable individually, in particular concerning the brightness and the color spectrum of the emitted light.

Moreover, the system is adaptive to the effect that it can compensate for external influences, for example daylight, such that a constant light or a constant change in the light, for example in a sales area, is ensured.

BRIEF DESCRIPTION OF THE DRAWINGS

Further features, advantages and properties of the present invention will now be explained in greater detail with reference to the figures of the accompanying drawings and the detailed explanation of an exemplary embodiment.

DETAILED DESCRIPTION

Figure 1:
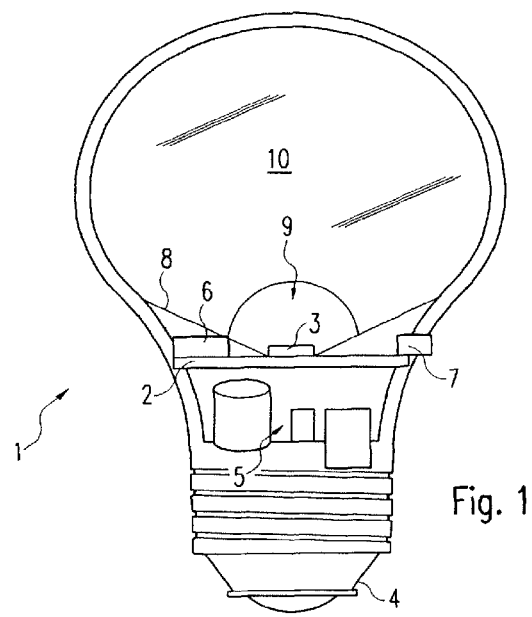
FIG. 1 shows a first exemplary embodiment of a retrofit LED module for conventional lampholders operated by power supply system current.

FIG. 1 illustrates an exemplary embodiment of the retrofit LED module 1, wherein the latter is provided for conventional power supply system current. For this purpose, it has a base 4 for screwing into conventional lampholders operated by power supply system current. An LED chip 3 is fitted on a carrier 2. In this case, the carrier can be one or a plurality of substrates. The latter preferably consist of silicon or a silicon compound.

It remains to be noted that it is likewise possible for a plurality of LEDs to be fitted on the carrier. Furthermore, it is conceivable to use a plurality of carriers with more LEDs. In this way, the main emission directions of the individual LEDs can be oriented in different directions. The total emission angle of the retrofit LED module can thus be increased.

Moreover, an electronic system 6 is situated on the carrier. Said electronic system is preferably a chip on board or an integrated circuit formed on the carrier. Further explanations in this respect can be found in the text of the description concerning FIGS. 3a, 3b and 3c.

Furthermore, the retrofit LED module comprises an electronic system 5, which is not integrated into the carrier or is not fitted on the latter. This electronic unit preferably consists of discrete electrical components. The components are primarily situated below the carrier, but can also be fitted laterally with respect to the LED. The space within the base can likewise be utilized in this way. The electronic system 5, which is merely indicated in FIG. 1, is a system for driving the LED 3. The latter comprises, in particular, voltage and current adaptation suitable for LEDs, as is known from the prior art. This can comprise, inter alia, a transformer for stepping down the power supply system voltage of, for example, 220 V or 110 V. In addition, an AC-DC current converter is expedient, which converts the AC current into DC voltage. Moreover, even further electrical components such as one or a plurality of capacitors and one or a plurality of inductors can be present. As already mentioned, FIG. 1 merely shows an indication of where the components are advantageously situated. The number, type and orientation and/or interconnection of the individual components is not disclosed here.

In principle, an embodiment is preferred in which only the components which cannot be realized as an integrated circuit on the carrier 2 are embodied in discrete fashion. One example of this would be the voltage transformer.

The retrofit LED module can comprise in each case one or a plurality of sensors 7 of different types.

The sensor can be one or a plurality of light sensors and/or daylight sensors. The latter can advantageously be used, in particular, for referencing the present illumination state with respect to the desired value.

Moreover, a color sensor system can be involved. The latter can be used for referencing the present color spectrum of the illuminated area with the desired value.

It is likewise conceivable for a temperature sensor system to be involved. The latter is advantageous particularly in the open for correct driving of the at least one LED.

It is also possible for a motion sensor system to be involved. The latter is advantageous particularly when the illumination is intended to react adaptively to movements. By way of example, it could be switched on automatically when a person enters a room.

Furthermore, an acoustic sensor can be involved. With the aid thereof, signals such as clapping or a voice command could change the state of the illumination, for example switch it on and off.

Said sensors are preferably likewise situated on the carrier 2. If possible, as in the case of a light sensor, the sensors are formed on the substrate of the carrier. However, there is also the possibility of spatially separating one or more sensors from the carrier 2. This is expedient, for example, if the sensor is not permitted to be influenced by the LED chip or the other electronic system, for example by the emitted light, emitted heat or electromagnetic waves.

One example thereof would be the use of a temperature sensor if the latter is intended for measuring the external temperature rather than the temperature of the LED chip. Such a measurement of the external temperature can be expedient when the retrofit LED module is used under great temperature fluctuations, such as occur outdoors, inter alia. Here, a temperature fluctuation can be detected by means of the temperature sensor and the driving of the LED can be adapted. As a result, the illumination can be kept constant and the lifetime of the retrofit LED module can be increased.

Furthermore, there is also the possibility, however, of mounting the sensor on the carrier and nevertheless separating it from other components, in particular the LED, by means of suitable shading means. The shading means are therefore designed such that the sensor is not influenced by the emitted light of the LED. This then involves a daylight sensor designed for measuring the amplitude of the ambient illumination.

One example of this is shown in FIG. 1. The LED 3 is situated in a cavity 8. The latter preferably has a reflective surface. A sensor 7 is fitted on the carrier 2 such that the cavity 8 spatially separates the sensor from the LED 3. Therefore, the sensor 7 also lies outside the emission angle of the LED. At the same time, the sensor is fitted on the carrier 2 such that the sensor projects laterally from the retrofit LED module. Consequently, it is possible, for example, to use a light sensor for measuring the ambient light. It remains to be noted that the sensor should at any rate be arranged such that it is not situated within the lampholder after the mounting of the retrofit LED module, that is to say that the sensor projects from the lampholder after the installation of the retrofit LED module.

The LED 3 is preferably situated in a capsule 9. The latter can consist of transparent silicone, for example. Furthermore, said capsule is preferably provided with a diffuser means. Moreover, the surface can be roughened for additional scattering of the emitted light. It would also be conceivable to insert an additional diffusing screen above the capsule. The size of the capsule can be varied in any desired manner, between a minimal covering of the LED chip and a complete filling of the space 10 above the LED chip.

If one or a plurality of blue LEDs 3 are used, a wavelength conversion means is preferably added to the capsule 9. In this way, part of the emitted blue light can be converted into yellow light. Consequently, the LED retrofit module emits white light in its entirety.

Figure 2:
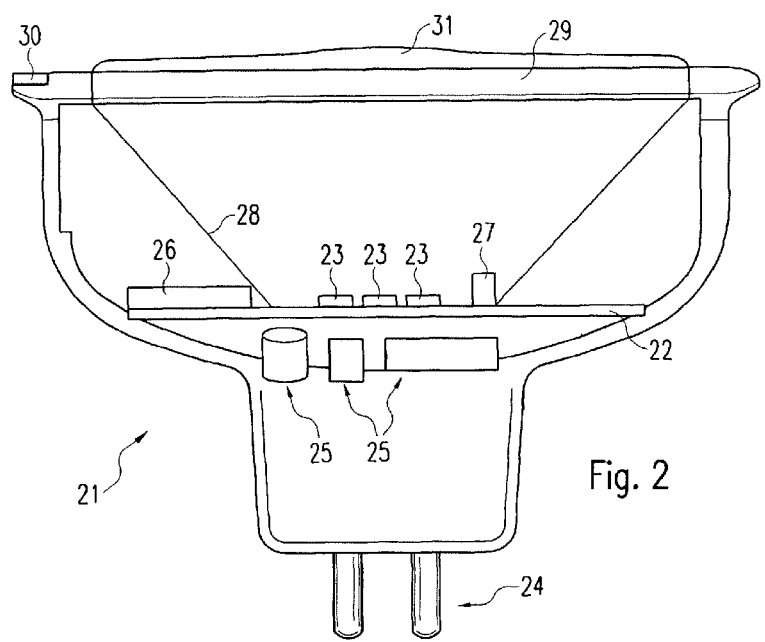
FIG. 2 shows a second exemplary embodiment of a retrofit LED module, serving as a low-voltage halogen lamp replacement, FIG. 3a schematically shows a first exemplary embodiment of a carrier with LED and control circuit, FIG. 3b schematically shows a second exemplary embodiment of a carrier with LED and control circuit, FIG. 3c schematically shows a third exemplary embodiment of a carrier with LED and control circuit.

FIG. 2 shows a second exemplary embodiment of a retrofit LED module 21. The latter is a low-voltage halogen emitter replacement. The latter has the two pins 24 for mechanical and electrical contact-connection.

Furthermore, a carrier 22 with an electronic system 26 is once again shown. Moreover, further, primarily discrete, electrical components 25 for voltage and current adaptation are situated below the carrier. In this exemplary embodiment, the retrofit LED module has two sensors 27 and 30. The sensor 27 is situated on the carrier 22 and within the cavity 28. Consequently, it is fitted within the emission range of the three LEDs 23. The sensor 23 is e.g. a light sensor that measures the integrated amplitude of the emitted light of the retrofit LED module. In this case, the measurement can be effected directly by the sensor 23 being designed such that it directly detects the light emitted by LEDs, or indirectly by the sensor 23 being designed such that it detects the light reflected at the walls of the cavity 28 and/or at a mixing screen 29. Advantageously, it is protected in this case from direct light incidence by shading means. The sensor can also be arranged at a different position, e.g. between the LEDs. The further sensor 30 is situated at the edge of the top side of the retrofit LED module. In this way, it is outside the emission range of the emitted light. Furthermore, the sensor 30 is not fitted on the carrier 22, but rather separated therefrom. It is likewise also possible to use additional shading means, such as an elevated edge of the cavity 28 or a laterally light-opaque lens 31 and/or diffusing screen 31. Therefore, the sensor 30 can be a daylight sensor 30, designed for detecting the ambient brightness.

However, it is also conceivable for the sensors 27 and alternatively or additionally to be color sensors designed for measuring the color spectrum of the ambient light. The sensor 27 can in turn be designed for color measurement of the light emitted by the LEDs and the sensor 30 for the color measurement of the ambient light.

In the case of the sensor 27, it is advantageous in this case if it is designed for detecting the mixed light from the LEDs 23, for example by said sensor, as described above, detecting the emitted light indirectly. It is also possible for each LED to be assigned a color and/or brightness sensor which directly measure the emitted light thereof and are possibly also additionally shaded in each case from the light of the other LEDs.

The color sensor can be a photodiode-based RGB (color) or XYZ (interference) filter. In the case of the RGB (color) filter, the color sensor has three photodiodes. Each of said photodiodes has a dedicated dielectric color filter for the colors red, green and blue. Therefore, the color components of the impinging light can be measured. The use of a color sensor with polymer filter coatings is also conceivable.

The color sensor used can likewise be a diode color sensor, in particular a CMOS (Complementary Metal Oxide Semiconductor) sensor. The latter preferably has a color sensor layer on a substrate, which layer comprises a plurality of different color sensor regions corresponding to different colors, e.g. red-green-blue. Said sensor layer is covered by a color filter layer, which is in turn covered by a protective film. Incident light is thus filtered by the filter layer such that each sensor measures the brightness of the corresponding light component. Likewise, a so-called black matrix layer and/or a transparent planarization layer can also be situated between sensor layer and filter layer.

In order to measure the light color, it is also possible to measure the temperature of the individual LEDs, in particular of the semiconductor junctions thereof, and thereby to determine the luminous intensity.

A photodiode-based XYZ (interference) filter sensor can be a so-called true color sensor, which carries out a color measurement on the basis of the standard spectral value function CIE 1931 (DIN5033). The XYZ (interference) filter sensor can be a sensor from the MTCS series such as the MTC-SiCs True Color Sensor from MATeT.

The light impinging on the sensor generates a photocurrent depending on the brightness. An electrical amplification system connected downstream converts the current into a voltage, which is digitized for calibration and signal processing. An evaluation can be effected in a correspondingly programmed microcontroller, e.g. an ASIC.

These aforementioned processing steps are preferably effected by an electronic system integrated into the carrier.

In this case, the resulting XYZ tristimulus values can also be converted into other color spaces such as e.g. Yxy or L*u'v'. A desired value L*u'v'(r) for color control and regulation can in this case be defined manually and/or be measured by a second color sensor, wherein the first sensor determines, for example, the luminous color of the LEDs and the second sensor determines the color of the ambient light. By means of the difference between a measured value and the desired value, an adaptation of the illumination can be performed. The latter can be implemented, for example, by means of corresponding PWM driving of the individual LEDs.

Advantageously, the operating temperature of the LEDs is concomitantly included in the digitized measured values to be evaluated, that is to say that the illumination is regulated not only by means of the color measurement, but alternatively or additionally by means of the temperature measurement. In one cost-effective embodiment, such temperature compensation can be effected by virtue of the fact that, in the case of a maximum operating power of the LEDs and an average operating temperature of 25° C., for example, the digitized sensor values are set to a low level, such as 60%, for example. Consequently, it is possible to prevent impermissibly high digitized sensor values from arising at an elevated operating temperature of the LEDs.

If the LEDs are operated with regulated current, the control unit, proceeding from the measured color values, can to compensate for the wavelengths of the light from the LEDs, said wavelengths changing as a result of different current intensities.

In order that the measurement of the sensor 27, if a light sensor is involved, for example, is nevertheless not adversely impaired by the LEDs, said sensor can, for example, be activated only if the LEDs are switched off. For this purpose, the sensor 27 is activated only in a short, periodically recurring time interval. The LEDs that are otherwise switched on are switched off during this time.

The number of sensors is in no way limited to two. Only two are shown here for elucidating the different possible orientations.

The three LEDs 23 are preferably one red, one green and one blue LED. In this way, white light can be generated by mixing the emitted light, for example by means of a diffusing screen 29. In addition, a lens 31 can be used. As shown in the first exemplary embodiment in FIG. 1, a transparent capsule with diffuser means can likewise be used for light scattering purposes (not shown in FIG. 2). It would also be conceivable, particularly in the case of relatively small emitters, to fill the entire space within the cavity with transparent filler.

In this exemplary embodiment, by virtue of the red, green and blue LEDs, it is likewise possible to generate light in a wide variety of color spectra. Thus, the retrofit LED module can be set to a wide variety of moods or be automatically adjusted thereto. Both brightness and spectrum of the emitted light can be adapted for this purpose.

Figure 3A:
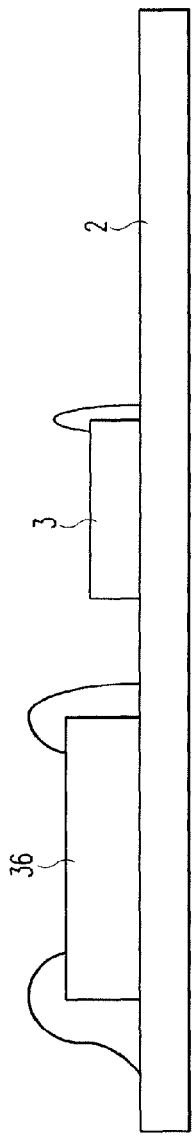
Figure 3B:
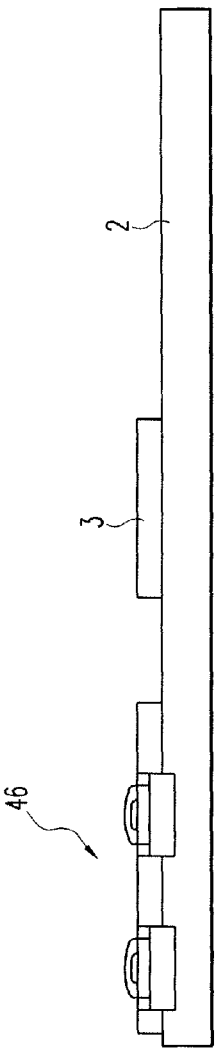
Figure 3C:
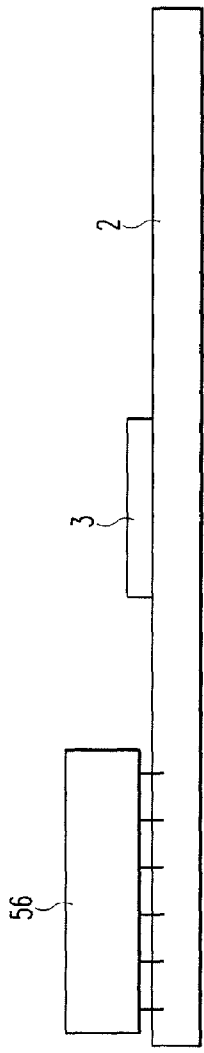

FIGS. 3a, 3b and 3c show exemplary embodiments of the carrier 28 with the electronic system situated thereon. The carrier preferably consists of one or a plurality of substrates. The latter are, in particular, silicon or silicon compounds. At least one LED 3 is fitted on the carrier. Said at least one LED can be fitted in a face-up or face-down position. Moreover, it is conceivable for said LED to have an additional substrate, for example composed of sapphire. Alternatively, however, a thin-chip LED can also be involved. This LED is mounted on the carrier 2 in a face-down position and the LED substrate, which is now situated on the top side, is subsequently removed.

In FIG. 3a, the electronic system 36 is realized as chip-on-board. In the case of chip-on-board technology (COB), unpackaged semiconductors, for example an integrated circuit (composed of silicon or other basic substances), are directly adhesively bonded onto the printed circuit board and then cold-welded to the circuit board by means of microwires (wire bonding). However, it is also conceivable to plug the chip, as shown in FIG. 3c, onto the carrier by means of electrically conductive pins. In this way, said chip is mechanically fixed and electrically connected to the carrier by through contacts.

An alternative possibility is shown in FIG. 3b. Here, the electronic system 46 integrated into the carrier is embodied as an integrated circuit on the substrate of the carrier. A CMOS (Complementary Metal Oxide Semiconductor) is shown schematically in this example. It has an n-MOS and a p-MOS alongside one another. It goes without saying that the integrated circuit consists of more than one CMOS in the real implementation.

The integrated circuit can also be arranged at least partially within the carrier, for example within a silicon substrate. Consequently, it is possible for the at least one LED to be fitted on the top side of precisely the substrate in which the integrated circuit or individual electronic components are situated.

The electronic system 3 on the carrier 2 can be embodied as an intelligent control circuit, for example as an ASIC or microcontroller. The latter is used for adaptively controlling the LED module.

The electronic system can additionally comprise one or a plurality of sensors. Light sensors, in particular, can be embodied, for example as inversely operated LED, on the carrier in an advantageous manner.

The control circuit digitizes the signals generated by the sensors by means of an A/D converter. Subsequently, they can be processed such that the mode of operation of the one or the plurality of LEDs is set to the ambient conditions. In addition, there is the possibility of controlling the mode of operation externally by means of a user interface, comprising at least one on/off switch.

For the purpose of making electrical contact with the LED and the control circuit, there is the possibility of wire bonding as shown in FIG. 3a. Furthermore, it is possible to realize electrical conductors in the carrier 2. Said conductors can consist of wires, for example composed of gold or copper. For finer contact-connection, such as is necessary in particular for a control circuit, there is the possibility of realizing conductors in the carrier via doping thereof and of insulating them from one another.

Finally, it should be noted that it is likewise conceivable to realize only part of the control circuit on the carrier and furthermore to use a separate control circuit. It would thus be possible, for example, to fit the control logic on the carrier and to fit a memory component connected thereto below the carrier in the retrofit LED module.

Figure 4:
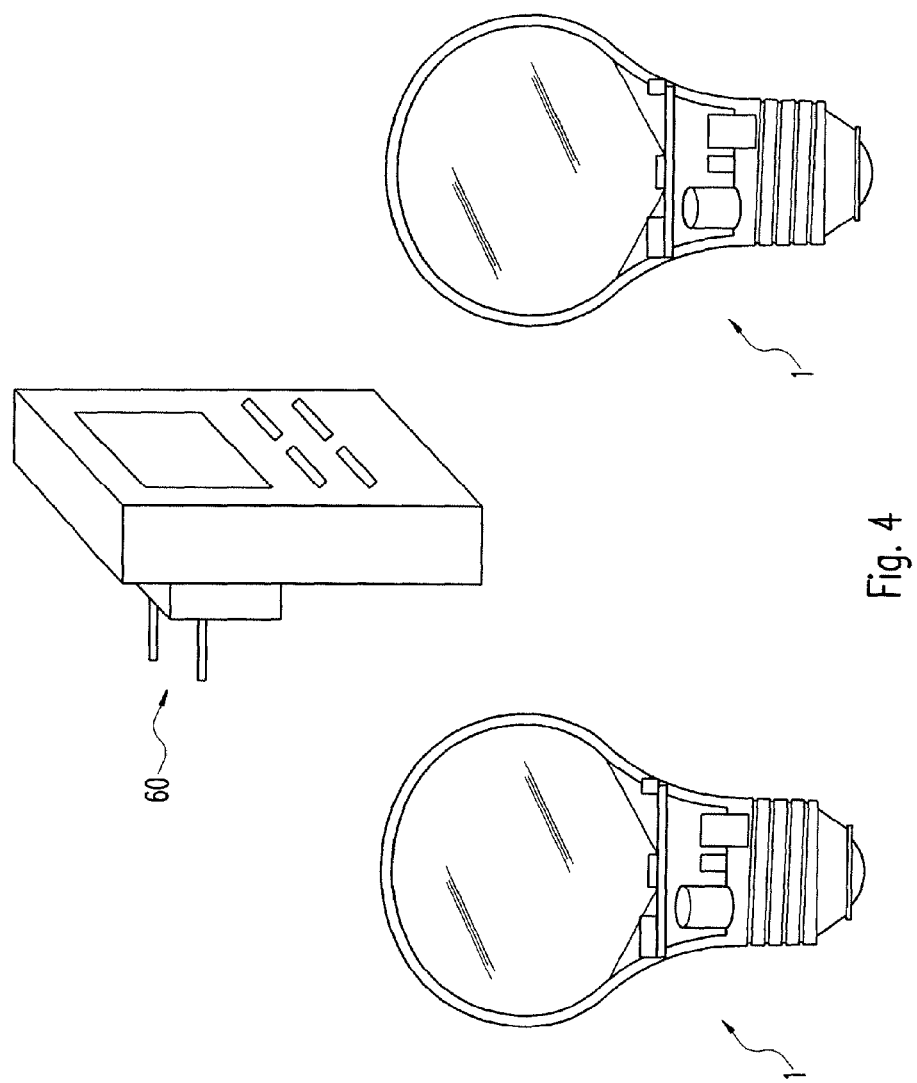
FIG. 4 shows an exemplary embodiment of a retrofit LED module system.

FIG. 4 shows a system, consisting of a plurality of elements, namely a central control unit 60 and two retrofit LED modules 1. The latter can be the embodiment from FIG. 1 for use with power supply system current or for the embodiment from FIG. 2 for use with low voltage or a combination thereof, wherein the number is not restricted to two. The embodiment from FIG. 1 is assumed below.

In the case of the adaptive illumination of an area, that is to say illumination adapted to the external conditions, it is necessary to operate all the luminous elements in a synchronized, i.e. coordinated, manner. For this purpose, it is necessary that a, preferably central, control unit regulates all the luminaires and that the lamps and the central control unit can communicate.

Such coordination is also necessary when, as described above, a sensor is intended to be active only when the LEDs are switched off, in order not to be impaired by them. This can be realized in this exemplary embodiment only when all the retrofit LED modules are switched off simultaneously, in order thus, for example, to be able to detect the actual ambient light or daylight.

For synchronization purposes, a communication means between the elements is furthermore necessary.

In this case, the communication can be realized via a radio interface which each individual element has. It can also be effected via a fixed conductor. For the latter, a cable can be laid between the elements. However, an existing network can also be utilized or the power supply system can be made utilizable for this purpose by means of an adapter. In this case, the power supply system current is superposed with high-frequency signals serving as communication between the elements. Each element requires an adapter for this purpose. In this way, by way of example, a network in the Ethernet standard can be realized. This type of communication has the advantage that the supply of current and the data communication are effected via the same cable.

The control unit 60 has a preferably integrated control circuit, for example an ASIC. In this example, the control unit is realized as a power supply system current plug. In this way, as described above, it simultaneously acquires a supply of current and a communication path to the retrofit LED modules.

Moreover, it comprises a user interface. The latter consists of an information output, such as a display and/or a loudspeaker, and an information input, such as conventional keys. However, a touch screen or voice recognition would also be conceivable for this purpose.

Furthermore, the control unit can have one or a plurality of sensors.

Furthermore, the system can comprise sensors which are separated from the control unit and the retrofit LED modules. This can be expedient when, for example, room lighting cannot be measured in an uncorrupted manner from any of the elements.

Alongside the control unit, it is still likewise possible for the individual retrofit LED modules to have a control circuit enabling the individual LEDs to be driven correctly. By way of example, it would also be conceivable for the central control unit, by means of the sensor signals, to calculate only guide values such as brightness and spectrum and to emit them to the individual retrofit LED modules. The latter in turn determine the precise driving of the individual LEDs on the basis of the guide values and by means of their own control circuits.

The system can also be embodied such that the individual retrofit LED modules are adjustable independently of one another by means of the central control unit. For this purpose, it is necessary for each individual retrofit LED module to have a unique identification, for example a network address. The latter can be assigned to the individual retrofit LED modules manually via the input of the control unit or automatically by the latter.

It is now conceivable that a plurality of systems, for example in a plurality of rooms in the same house or in a plurality of regions in a room, are intended to be utilized. For this purpose, either a single central control unit can be used, which can control the illumination of the individual rooms independently of one another, or each individual room can have a control unit. At any rate, correct addressing of the individual retrofit LED modules is necessary in order to avoid command conflicts and to guarantee individual illumination of the rooms.

A user-friendly method for address allocation or the assignment of the individual retrofit LED modules to a specific control unit could proceed as follows: a first room is equipped with new retrofit LED modules. Afterward, a first control unit is plugged into a socket and an initialization is started. The new retrofit LED modules, which therefore do not yet have an address, are allocated a unique address for the first time by the control unit. Alternatively, these could also be assigned to the control unit. This could be realized, for example, with allocation of an identification to the control unit.

Afterward, the same procedure is carried out in a second room. Since the retrofit LED modules of the first room already have an address and/or an identification of the first control unit, these are ignored by the second control unit during addressing. A conflict between the commands of the individual control units is thus avoided.

The system likewise has the possibility of erasing the addresses of individual retrofit LED modules, i.e. resetting the latter and the uninitialized state. This erasure can be carried out manually by means of the control unit, or automatically, for example, if a retrofit LED module is separated from the supply of current for a specific time.

By virtue of the addressing, there is additionally the possibility of selecting, by means of a control unit in a first room, in a targeted manner, one or a plurality of retrofit LED modules in a second room, in order to change their settings. Consequently, from a first room, with a first control unit, it is possible to change the illumination in a second room with a second control unit. Therefore, there is the possibility of remote control.

A further advantageous property of the system is its user-friendly adaptability. The system can be set once by the user to the desired type of illumination of an area, in particular concerning the brightness and spectral distribution. However, the system subsequently references not only the setting but primarily also the measurement signals of the sensors. These measurement signals furthermore serve as reference values. That means that the retrofit LED modules are operated in such a way that the present measurement results of the sensors correspond to the reference values. In this way, externally governed change, such as daylight, can be compensated for. This constant illumination is particularly advantageous in a store, for example.

Furthermore, however, there is also the possibility of programming the system in such a way that a targeted change in the illumination is achieved. By virtue of the adaptivity of the system, external influences can again be compensated for in such a way that the change is not adversely impaired by the external influences.

A further application consists in the illumination of a greenhouse. As is known, plants require in particular blue, i.e. short-wave, and red, i.e. long-wave, light for photosynthesis. The system can now be adapted such that the plants receive the light spectrum that is optimal for them. On account of the adaptivity of the system, changes such as the time of day or occupancy of the greenhouse can automatically be compensated for by the system.

Furthermore, the system can be designed adaptively in the form such that only the retrofit LED modules which measure green light by means of a color sensor system emit light. In this way, only the region in which green plants are situated is illuminated. Empty space such as a grey base or brown soil is not illuminated.

A further embodiment (not shown in FIG. 4) consists in the individual elements of the system being mechanically connected to one another and thus forming a uniform device. By way of example, an uplighter comprising a plurality of luminaires could be realized in this way.

LIST OF REFERENCE SYMBOLS

1 Retrofit LED module for power supply system current
2 Carrier
3 LED
4 Lamp base
5 Driving electronic system
6 Control circuit
7 Sensor on carrier and shaded from LED
8 Cavity
9 LED capsule
10 Lamp space above the carrier
21 Retrofit LED module for low-voltage supply
22 Carrier
23 RGB-LEDs
24 Contacts of the retrofit LED module
25 Driving electronic system
26 Control circuit
27 Sensor on carrier and within the emission range of the LED
28 Cavity
29 Diffusing screen
30 Sensor separate from carrier and outside the emission range of the LED
31 Lens
36 Chip-on-board
46 Integrated circuit on carrier
56 Chip for plugging onto carrier
60 Control unit

The invention claimed is:

1. A retrofit light emitting diode (LED) module comprising:
a carrier with at least one LED;
a retrofit connection for mechanical and electrical contact-connection to lamp holders; and
an electronic system for driving the at least one LED, at least one part of the electronic system being integrated into the carrier, and the electronic system including
a first sensor for sensing at least one of an integrated amplitude or a color spectrum of emitted light of the retrofit LED module,
a second sensor for sensing at least one of an ambient brightness or a color spectrum of an ambient light, and
an electronic circuit for signal processing.

2. The retrofit LED module as claimed in claim 1, wherein the carrier, on which the at least one LED is situated, comprises at least one substrate composed of silicon or a silicon compound.

3. The retrofit LED module as claimed in claim 1, wherein the at least one part of the electronic system which is integrated into the carrier is embodied as chip-on-board technology and is fitted on the carrier.

4. The retrofit LED module as claimed in claim 2, wherein the at least one part of the electronic system which is integrated into the carrier is embodied as an integrated circuit in the substrate of the carrier.

5. The retrofit LED module as claimed in claim 1, wherein the at least one part of the electronic system which is integrated into the carrier comprises an application specific integrated circuit (ASIC) or microcontroller for adaptively controlling the retrofit LED module.

6. The retrofit LED module as claimed in claim 1, wherein the electronic system further includes at least one of a temperature sensor system, a motion sensor system, or an acoustic sensor system.

7. The retrofit LED module as claimed in claim 1, wherein the first and second sensors are disposed so as to be at least one of: within a main emission angle of the at least one LED or shaded from light from other LEDs.

8. The retrofit LED module as claimed in claim 1, wherein the electronic system further includes a driving electronic system that enables the at least one LED to be dimmed.

9. The retrofit LED module as claimed in claim 1, further comprising at least one red LED, one green LED, and one blue LED, each LED being independently drivable via the electronic system.

10. The retrofit LED module as claimed in claim 1, wherein the electronic system further includes a light sensor system and is activated only in time intervals temporally separated from one another, and
wherein the at least one LED is switched off in the time intervals in which the light sensor system is activated.

11. A retrofit light emitting diode (LED) module system comprising:
at least two retrofit LED modules, each retrofit LED module including:
a carrier,
at least one LED situated on the carrier,
an electronic system for driving the at least one LED; and
a retrofit connection for mechanical and electrical contact-connection to lamp holders; and
at least one control unit that regulates the retrofit LED modules in an adaptive and synchronized manner,
wherein the respective electronic system of each retrofit LED module includes
a first sensor for sensing an integrated amplitude of emitted light of the respective retrofit LED module, and
an electronic circuit for signal processing,
wherein the at least one control unit includes a second sensor for sensing at least one of ambient brightness or a color spectrum of ambient light,
wherein the at least one control unit is configured to provide guide values for the brightness and color spectrum to individual retrofit LED modules, and
wherein each retrofit LED module is configured to determine at least one of the brightness or color of the emitted light of the respective retrofit LED module based on the guide values and the respective electronic systems thereof.

12. The retrofit LED module system as claimed in claim 11, wherein, in each retrofit LED module, at least one part of the electronic system is integrated into the carrier.

13. The retrofit LED module system as claimed in claim 11, further comprising at least one light sensor system which is activated only in time intervals temporally separated from one another, and
   wherein the LEDs of the retrofit LED modules are switched off in the time intervals in which the light sensor system is activated.

14. The retrofit LED module system as claimed in claim 11, wherein the at least one control unit and the at least two retrofit LED modules intercommunicate.

15. The retrofit LED module system as claimed in claim 11, wherein each retrofit LED module has at least one of a unique address or an assignment to a control unit primarily responsible therefor.

16. The retrofit LED module system as claimed in claim 11, wherein brightness and color spectrum of emitted light from each individual retrofit LED module is adjustable individually.

17. The retrofit LED module system as claimed in claim 11, wherein the retrofit LED module system is configured to compensate for external influences to maintain a constant light or a constant change in the light.

\* \* \* \* \*